United States Patent
Yang et al.

(10) Patent No.: US 10,153,193 B2
(45) Date of Patent: Dec. 11, 2018

(54) INTEGRATED CIRCUIT FOR A STABLE ELECTRICAL CONNECTION AND MANUFACTURING METHOD THEREOF

(71) Applicant: SAMSUNG DISPLAY CO., LTD., Yongin-si, Gyeonggi-do (KR)

(72) Inventors: Jeong Do Yang, Yongin-si (KR); Byoung Yong Kim, Seoul (KR); Seung-Soo Ryu, Hwaseong-si (KR); Sang Hyeon Song, Seoul (KR); Jung Yun Jo, Namyangju-si (KR); Seung-Hwa Ha, Hwaseong-si (KR); Jeong Ho Hwang, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 8 days.

(21) Appl. No.: 15/615,123

(22) Filed: Jun. 6, 2017

(65) Prior Publication Data
US 2017/0365503 A1   Dec. 21, 2017

(30) Foreign Application Priority Data
Jun. 15, 2016   (KR) .................. 10-2016-0074441

(51) Int. Cl.
*H01L 21/70*  (2006.01)
*H01L 23/29*  (2006.01)
(Continued)

(52) U.S. Cl.
CPC .......... *H01L 21/707* (2013.01); *H01L 23/293* (2013.01); *H01L 23/5227* (2013.01);
(Continued)

(58) Field of Classification Search
CPC . H01L 21/707; H01L 23/293; H01L 23/3192; H01L 23/5227; H01L 23/5252;
(Continued)

(56) References Cited

U.S. PATENT DOCUMENTS

2003/0022477 A1* 1/2003 Hsieh .................. H01L 21/4853
438/612
2012/0025371 A1* 2/2012 Matsui ................ H01L 23/3192
257/737

FOREIGN PATENT DOCUMENTS

JP   2009-049285   3/2009
JP   2012-080383   4/2012
(Continued)

OTHER PUBLICATIONS

Keswick et al., "Compliant Bumps for Adhesive Flip-Chip Assembly." IEEE Transactions on Components, Packaging, and Manufacturing Technology—Part B, vol. 18, No. 3, Aug. 1995, pp. 503-510.
(Continued)

*Primary Examiner* — Brook Kebede
(74) *Attorney, Agent, or Firm* — F. Chau & Associates, LLC

(57) ABSTRACT

An integrated circuit includes a substrate, a pad electrode disposed on the substrate, and a passivation layer disposed on the pad electrode and including an organic insulating material. The integrated circuit further includes a bump electrode disposed on the passivation layer and connected to the pad electrode through a contact hole. The passivation layer includes an insulating portion having a first thickness and covering an adjacent edge region of the pad electrode and the substrate, and a bump portion having a second thickness, that is greater than the first thickness, and covering a center portion of the pad electrode.

21 Claims, 9 Drawing Sheets

(51) Int. Cl.
- *H01L 23/522* (2006.01)
- *H01L 23/525* (2006.01)
- *H01L 23/532* (2006.01)
- *H01L 27/12* (2006.01)
- *H01L 49/02* (2006.01)

(52) U.S. Cl.
CPC .... *H01L 23/5252* (2013.01); *H01L 23/53238* (2013.01); *H01L 27/12* (2013.01); *H01L 49/02* (2013.01)

(58) Field of Classification Search
CPC ... H01L 23/53238; H01L 24/05; H01L 24/11; H01L 24/13; H01L 27/12; H01L 49/02
USPC .......... 438/128, 612–617; 257/737
See application file for complete search history.

(56) References Cited

FOREIGN PATENT DOCUMENTS

| | | |
|---|---|---|
| JP | 2013-030789 | 2/2013 |
| KR | 10-2001-0019775 | 3/2001 |
| KR | 10-2007-0119790 | 12/2007 |

OTHER PUBLICATIONS

Lin et al., "Conductive Polymer Bump Interconnects." IEEE, Electronic Components and Technology Conference, 1996, pp. 1059-1068.
Ahn et al., "Failure in the COG Joint Using Non-Conductive Adhesive and Polymer Bumps." Journal of Microelectronics & Packaging Society, vol. 14, No. 1, 2007, pp. 33-38.
An et al., "Fine Pitch" NCF-type Compliant-bumped COG. 2007, pp. 1-4.
Chen et al., "Theoretical Stress Calculation and Experimental Results of "NCF-type Compliant-Bumped COG"." IEEE, 2007 9th Electronics Packaging Technology Conference, 2007, pp. 71-74.
Lin et al., "Reliability of 20 um pitch NCF type COF package with compliant-bump." IEEE, Assembly and Circuits Technology Conferences, 2009, pp. 568-571.
Kim et al., "Review paper: Flip chip bonding with anisotropic conductive film (ACF) and nonconductive adhesive (NCA)." Current Applied Physics 13, 2013, pp. S14-S25.
Tanaka, et al., "Resin Core Bump Technology for Highly Reliable 20 μm Pitch Chip on Glass Interconnections," Transactions of the Japan Institute of Electronics Packaging, vol. 1, No. 1, 2008, pp. 36-39.

* cited by examiner

INTEGRATED CIRCUIT FOR A STABLE ELECTRICAL CONNECTION AND MANUFACTURING METHOD THEREOF

CROSS-REFERENCE TO RELATED APPLICATION

This application claims priority under 35 U.S.C. § 119 to Korean Patent Application No. 10-2016-0074441 filed on Jun. 15, 2016 in the Korean Intellectual Property Office, the disclosure of which is incorporated by reference herein in its entirety.

TECHNICAL FIELD

One or more exemplary embodiments of the present inventive concept relate to an integrated circuit, and more particularly, to an integrated circuit for a stable electrical connection and a manufacturing method thereof.

DISCUSSION OF THE RELATED ART

A display device may include a substrate, a plurality of signal lines, and thin film transistors provided on the substrate adjacent to a display area. Further, an integrated circuit (IC) for generating various signals for driving the display device may be disposed in a region of the substrate. A pad portion of the display device is electrically connected to the signal lines disposed on the substrate. To electrically connect the pad portion of the substrate to an output electrode of the IC, an anisotropic conductive film (ACF) is provided between the substrate and the substrate of the IC.

The anisotropic conductive film (ACF) may include a plurality of conductive particles, and a size of the conductive particles is decreased as a resolution of the display device becomes greater. In this case, a number of the conductive particles may be increased so as to prevent a reduction in conductivity. However, as the number of the conductive particles is increased, a short circuit defect caused by aggregation of conductive particles may occur. Further, a distribution of the conductive particles may be irregular so a difference of resistance between the pad portions of the substrate may occur.

SUMMARY

According to an exemplary embodiment of the present inventive concept, an integrated circuit includes a substrate, a pad electrode disposed on the substrate, and a passivation layer disposed on the pad electrode and including an organic insulating material. The integrated circuit further includes a bump electrode disposed on the passivation layer and connected to the pad electrode through a contact hole. The passivation layer includes an insulating portion having a first thickness and covering an adjacent edge region of the pad electrode and the substrate, and a bump portion having a second thickness, that is greater than the first thickness, and covering a center portion of the pad electrode.

In an exemplary embodiment of the present inventive concept, the bump portion of the passivation layer is disposed on the pad electrode.

In an exemplary embodiment of the present inventive concept, the bump portion of the passivation layer has a semicircular shaped cross-section.

In an exemplary embodiment of the present inventive concept, the passivation layer includes a photosensitive organic material.

In an exemplary embodiment of the present inventive concept, the passivation layer includes polyimide, polybenzoxazole, acryl, phenol, silicon, silicon modified polyimide, or epoxy-based polymer materials.

In an exemplary embodiment of the present inventive concept, the contact hole is disposed in an insulating portion of the passivation layer.

In an exemplary embodiment of the present inventive concept, the pad electrode includes multiple layers.

In an exemplary embodiment of the present inventive concept, the integrated circuit further includes a protrusion disposed on an upper surface of the bump electrode.

In an exemplary embodiment of the present inventive concept, the passivation layer further includes non-conductive particles.

In an exemplary embodiment of the present inventive concept, the passivation layer includes a plurality of bump portions, and the pad electrode overlaps at least two bump portions.

According to an exemplary embodiment of the present inventive concept, a method for manufacturing an integrated circuit, includes forming a pad electrode on a substrate and forming an organic insulating material layer on the pad electrode and substrate. The method for manufacturing an integrated circuit further includes patterning the organic insulating material layer to form a passivation layer including an insulating portion having a first thickness and covering an edge region of the pad electrode and at least part of the substrate, and a bump portion having a second thickness, that is greater than the first thickness, and covering a substantially center portion of the pad electrode. The method for manufacturing an integrated circuit additionally includes forming a bump electrode on the passivation layer and connected to the pad electrode.

In an exemplary embodiment of the present inventive concept, a slit mask or a half-tone mask is used in the patterning of the organic insulating material layer.

In an exemplary embodiment of the present inventive concept, the method for manufacturing an integrated circuit further includes curing the passivation layer after forming the passivation layer.

In an exemplary embodiment of the present inventive concept, the method for manufacturing an integrated circuit further includes forming a metal seed layer on the passivation layer. The method for manufacturing an integrated circuit additionally includes forming a photoresist pattern including an opening region on the metal seed layer and growing the metal seed layer disposed inside the opening region using an electroplating method. The method for manufacturing an integrated circuit further includes removing the photoresist pattern and etching the metal seed layer to remove a portion excluding a portion where the metal seed layer grows, and forming a bump electrode.

In an exemplary embodiment of the present inventive concept, the method for manufacturing an integrated circuit further includes forming a contact hole in an insulating portion of the passivation layer and overlapping at least part of the pad electrode. The bump electrode is connected to the pad electrode through the contact hole.

In an exemplary embodiment of the present inventive concept, the bump portion of the passivation layer is disposed on the pad electrode.

In an exemplary embodiment of the present inventive concept, the bump portion of the passivation layer has a semicircular shaped cross-section.

In an exemplary embodiment of the present inventive concept, the organic insulating material layer includes polyimide, polybenzoxazole, acryl, phenol, silicon, silicon modified polyimide, or epoxy-based polymer materials.

In an exemplary embodiment of the present inventive concept, the organic insulating material layer includes non-conductive particles, and a protrusion is formed on an upper surface of the bump electrode.

In an exemplary embodiment of the present inventive concept, the passivation layer includes a plurality of bump portions, and the pad electrode overlaps at least two of the plurality of bump portions.

According to an exemplary embodiment of the present inventive concept, a method for manufacturing an integrated circuit includes a substrate, a pad electrode disposed on the substrate, and a passivation layer disposed on the pad electrode and including an organic insulating material and a bump portion. The integrated circuit further includes a bump electrode disposed on the passivation layer, conforming to a shape of the bump portion, and connected to the pad electrode through a contact hole. A width of the bump electrode is smaller than a width of the pad electrode.

In an exemplary embodiment of the present inventive concept, the passivation layer further includes an insulating portion having a first height extending from the substrate. The bump portion has a second height greater than the first height extending from the substrate.

In an exemplary embodiment of the present inventive concept, the bump portion of the passivation layer has an arch-like shaped cross-section.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION

Figure 1:
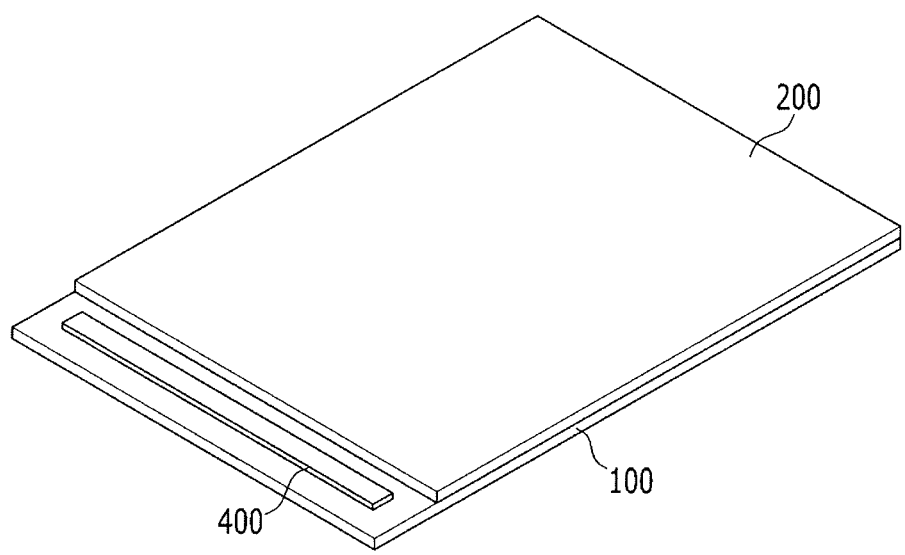
FIG. 1 shows a perspective view of a display device according to an exemplary embodiment of the present inventive concept.

Exemplary embodiments of the present inventive concept will be described more fully hereinafter with reference to the accompanying drawings.

To clearly describe exemplary embodiments of the present inventive concept, elements and features which do not relate to the description are omitted, and reference numerals that are similar or identical may designate similar or identical elements or features throughout the specification and drawings.

In the drawings, the thickness of layers, films, panels, regions, etc., maybe exaggerated for clarity. In addition, for better understanding and ease of description, the thickness of some layers and areas maybe exaggerated.

It will be understood that when an element such as a layer, film, region, or substrate is referred to as being "on" another element, it may be directly on the other element or intervening elements may also be present. Further, in the specification, the word "on" or "above" means positioned on or below the object portion, and does not necessarily mean positioned on the upper side of the object portion based on a gravitational direction.

A display device according to an exemplary embodiment of the present inventive concept will now be described with reference to FIG. 1.

FIG. 1 shows a perspective view of a display device according to an exemplary embodiment of the present inventive concept.

As shown in FIG. 1, the display device may include a wiring substrate 100, an encapsulation substrate 200 facing the wiring substrate 100, and an integrated circuit (IC) 400.

The wiring substrate 100 may include a display area for displaying a visual image and a peripheral area adjacent to the display area for transmitting a signal to the display area. The display area may occupy most of a region of the wiring substrate 100, and the peripheral area may be adjacent to a first edge of the display area. However, exemplary embodiments of the present inventive concept are not limited thereto, and arrangements of the display area and the peripheral area may be changed in various ways. For example, the peripheral area may partially surround a parameter of the display area. For example, the peripheral area may surround the display area such that the peripheral area forms an L shape around the display area.

The encapsulation substrate 200 may be disposed on the wiring substrate 110 such that the encapsulation substrate 200 covers the display area of the wiring substrate 100, and the integrated circuit (IC) 400 is disposed in the peripheral area of the wiring substrate 100. The encapsulation substrate 200 and the integrated circuit (IC) 400 cover different portions of the wiring substrate 100 so that they do not overlap each other. The encapsulation substrate 200 is smaller than the wiring substrate 100, and the integrated circuit (IC) 400 is smaller than the wiring substrate 100.

In addition, a non-conductive film (NCF) is disposed between the integrated circuit (IC) 400 and the wiring substrate 100. The non-conductive film causes adhesion between the integrated circuit (IC) 400 and the wiring substrate 100. The non-conductive film (NCF) is made of a non-conductive material.

The display device, according to an exemplary embodiment of the present inventive concept, may include a liquid crystal display or an organic light emitting device.

An integrated circuit (IC) of a display device, according to an exemplary embodiment of the present inventive concept, will now be described with reference to FIG. 2.

Figure 2:
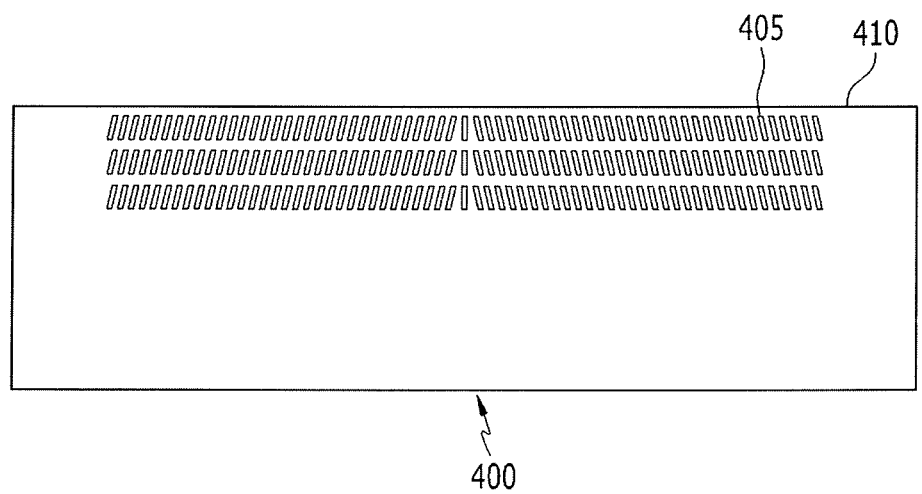
FIG. 2 shows a plan view of an integrated circuit (IC) of a display device according to an exemplary embodiment of the present inventive concept.

FIG. 2 shows a plan view of an integrated circuit (IC) of a display device according to an exemplary embodiment of the present inventive concept.

As shown in FIG. 2, the integrated circuit (IC) 400 of the display device according to an exemplary embodiment of the present inventive concept includes a substrate 410 and a plurality of pads 405 disposed on the substrate 410.

A first set of pads of the plurality of pads 405 may be connected to a gate pad portion disposed on the wiring substrate 100, and a second set of pads of the plurality of pads 405 may be connected to a data pad portion disposed on the wiring substrate 100. Further, the first set of pads 405 may transmit a gate signal, and the second set of pads 405 may transmit a data signal. Each pad of the plurality of pads 405 may have a quadrangular shape. A first portion of pads 405 may be provided in a center of the substrate 410 extending in a vertical direction, and a second and a third portion of pads 405 may be provided on a left and a right of the first portion of pads 405, respectively, and may be slanted with respect to the vertical direction. In this case, second portion of pads 405 and the third portion of pads 405 each have a constant slope, but exemplary embodiments of the present inventive concept are not limited thereto. For example, as the pads 405 provided on the substrate 410 become more distant from the first portion of pads 405, the slope may become greater.

An integrated circuit (IC) according to an exemplary embodiment of the present inventive concept will now be described with reference to FIG. 3 and FIG. 4.

Figure 3:
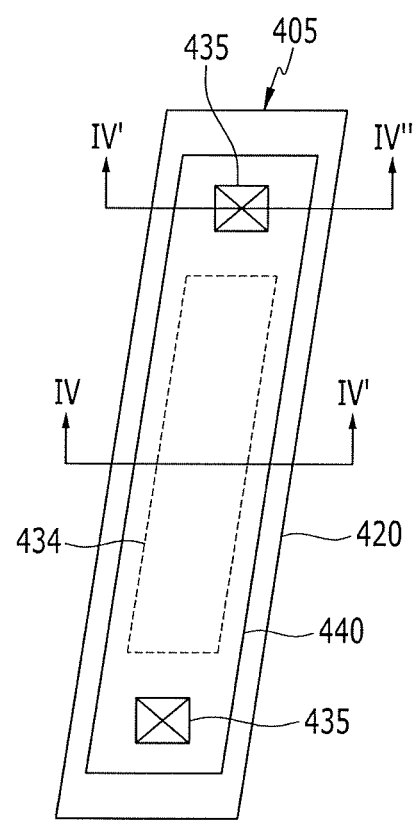
FIG. 3 shows a plan view of a pad portion of an integrated circuit (IC) according to an exemplary embodiment of the present inventive concept.
Figure 4:
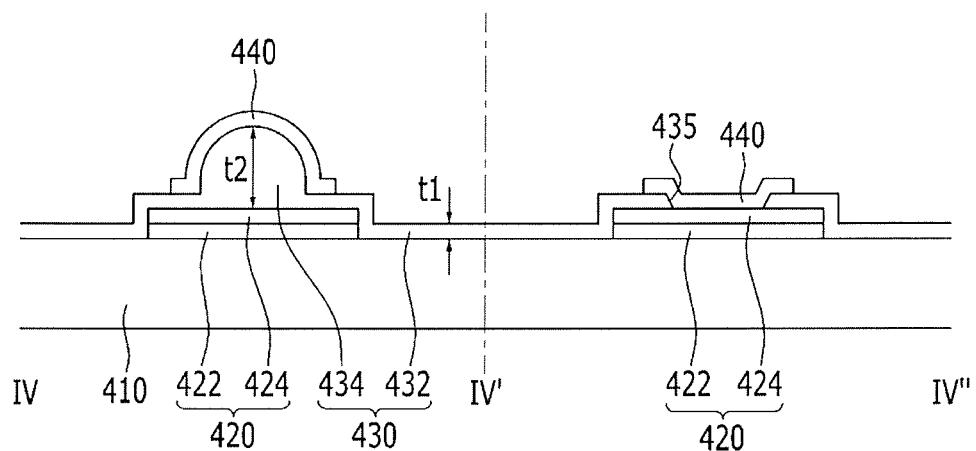
FIG. 4 shows a cross-sectional view of an integrated circuit (IC) according to an exemplary embodiment of the present inventive concept with respect to lines IV-IV' and IV'-IV" of FIG. 3.

FIG. 3 shows a plan view of a pad 405 of an IC according to an exemplary embodiment of the present inventive concept, and FIG. 4 shows a cross-sectional view of an integrated circuit (IC) according to an exemplary embodiment of the present inventive concept with respect to lines IV-IV' and IV'-IV" of FIG. 3.

As shown in FIG. 3 and FIG. 4, the integrated circuit (IC) includes the substrate 410, a pad electrode 420 disposed on the substrate 410, a passivation layer 430 disposed on the pad electrode 420, and a bump electrode 440 disposed on the passivation layer 430.

The pad electrode 420 is made of a metal material. The pad electrode 420 may be a single layer or multiple layers. For example, the pad electrode 420 may include a first pad electrode layer 422 disposed on the substrate 410 and a second pad electrode layer 424 disposed on the first pad electrode layer 422. The first pad electrode layer 422 and the second pad electrode layer 424 may be made of different materials. For example, the first pad electrode layer 422 may be made of titanium (Ti), and the second pad electrode layer 424 may be made of gold (Au).

A planar shape of the pad electrode 420 may be a quadrangle and may be polygonal (e.g., a rectangular shape). The pad electrode 420 may extend longer in one direction than in another direction. For example, a length of the pad electrode 420 may be greater than a width of the pad electrode 420.

The passivation layer 430 may be made of a polymer material with photosensitivity. For example, the passivation layer 430 includes a polymer material such as polyimide, polybenzoxazole, acryl, phenol, silicon, silicon modified polyimide, or epoxy, and includes a photosensitive organic material.

The passivation layer 430 may be disposed on the pad electrode 410 such that it covers the substrate 410 and the pad electrode 420. The passivation layer 430 includes an insulating portion 432 and a bump portion 434, each with a different thickness from each other. The insulating portion 432 and the bump portion 434 are integrally formed.

The insulating portion 432 may cover a portion of the pad electrode 420 and the substrate 410. For example, the insulating portion 432 may cover an adjacent edge region of the pad electrode 420. As an additional example, the insulating portion 432 may cover a portion of an upper surface of the pad electrode 420 and cover a side surface of the pad electrode 420 extending in a direction perpendicular to the substrate 410 and connected to the upper surface of the pad electrode 420. The insulating portion 432 may be disposed on the adjacent edge region of the pad electrode 420 and the substrate 410. The insulating portion 432 has a first thickness t1. The insulating portion 432 may have a substantially constant thickness.

The bump portion 434 covers a center portion of the pad electrode 420. The bump portion 434 may be disposed on the pad electrode 420. The bump portion 434 has a second thickness t2, and the second thickness t2 is greater than the first thickness t1. The bump portion 434 might not have a constant thickness. A center portion of the bump portion 434 has the second thickness t2 that may be greatest, and the bump portion 434 may become gradually thinner as it goes to an edge portion from the center portion. The bump portion 434 may have a semicircular shape in a cross-sectional view. In an exemplary embodiment of the present inventive concept, the bump portion 434 may have an arch-like shape.

A contact hole 435 overlapping at least part of the pad electrode 420 is provided in the insulating portion 432 of the passivation layer 430. One contact hole 435 is provided on a first end of the pad electrode 420 and another contact hole 435 is provided on a second end, opposite the first end, of the pad electrode 420. In addition, the bump portion 434 may be provided between both the contact holes 435. In addition, a number of contact holes 435 formed and a position of the contact holes 435 may be modified in various ways.

The bump electrode 440 is connected to the pad electrode 420 through the contact hole 435. The bump electrode 440 is provided on the passivation layer 430 and the pad electrode 420.

A planar shape of the bump electrode 440 is similar to that of the pad electrode 420. The planar shape of the bump electrode 440 may be quadrangular. For example, the planar shape of the bump electrode 440 may be polygonal (e.g., a rectangular shape). The bump electrode 440 may extend longer in one direction than in another direction. The bump electrode 440 may be smaller than the pad electrode 420.

The bump electrode 440 may be made of a metal material. For example, it may be made of gold (Au), copper (Cu), silver (Ag), platinum (Pt), palladium (Pd), nickel (Ni), and/or aluminum (Al). The bump electrode 440 may have a single layer or multiple layers. For example, when the bump electrode 440 is configured to have multiple layers, it may be formed to be stacked with a lower layer made of titanium (Ti), titanium-tungsten (TiW), and/or chromium (Cr) and an upper layer made of gold (Au), copper (Cu), silver (Ag), platinum (Pt), palladium (Pd), nickel (Ni), and/or aluminum (Al). However, exemplary embodiments of the present inventive concept are not limited thereto.

The bump electrode 440 is electrically connected to the pad electrode 420 so it receives a signal from the pad electrode 420. While the IC (e.g., 400 of FIG. 1) is connected to the wiring substrate (e.g., 100 of FIG. 1), the bump electrode 440 transmits the signal provided by the pad electrode 420 to the wiring substrate (e.g., 100 of FIG. 1). When the IC (e.g., 400 of FIG. 1) and the wiring substrate (e.g., 100 of FIG. 1) are pressurized, the bump portion 434 of the passivation layer 430 disposed below the bump electrode 440 may be pressed and released to prevent the non-conductive film provided between the IC (e.g., 400 of FIG. 1) and the wiring substrate (e.g., 100 of FIG. 1) from being lifted, thereby maintaining a constant gap between the IC (e.g., 400 of FIG. 1) and the wiring substrate (e.g., 100 of FIG. 1). The bump portion 434 on the pad 405 may have a constant distance from an adjacent bump portion 434 on another pad 405 so a short circuit defect between adjacent pads 405 may be prevented. In an exemplary embodiment of the present inventive concept, the bump portion 434 may have a substantially constant length and width (e.g., diameter); however, exemplary embodiments of the present inventive concept are not limited thereto. The bump electrode 440 provided on the bump portion 434 surface-contacts the wiring substrate (e.g., 100 of FIG. 1) thereby preventing generation of a difference of resistance among a plurality of pad portions.

A method for manufacturing an integrated circuit (IC) according to an exemplary embodiment of the present inventive concept will now be described with reference to FIG. 5 to FIG. 11.

FIGS. 5 to 11 are cross-sectional views sequentially showing several steps for manufacturing an IC according to an exemplary embodiment of the present inventive concept.

Figure 5:
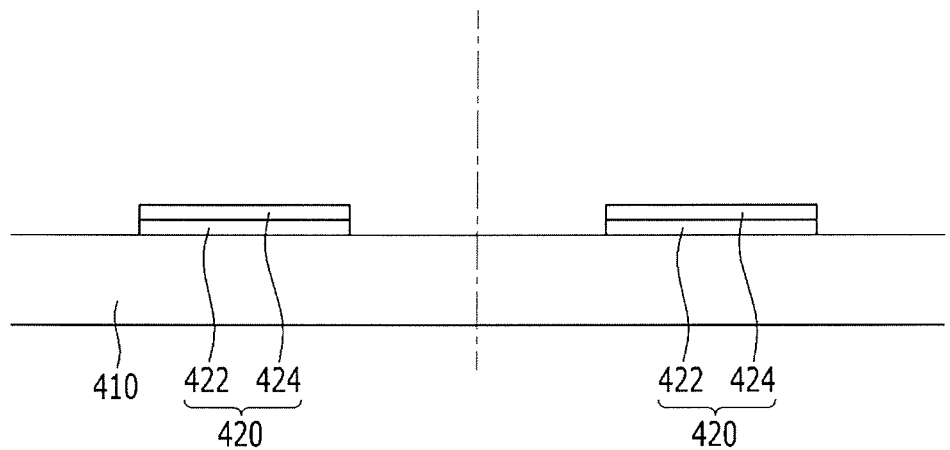
FIGS. 5, 6, 7, 8, 9, 10 and 11 are cross-sectional views sequentially showing several steps for manufacturing an integrated circuit (IC) according to an exemplary embodiment of the present inventive concept.

As shown in FIG. 5, a metal material is deposited on a substrate 410 and is patterned to form a pad electrode 420. The pad electrode 420 may have multiple layers or just a single layer. When a plurality of metal materials is sequentially deposited on the substrate 410 and are simultaneously patterned to form a pad electrode 420, the pad electrode 420 may have multiple layers. For example, titanium (Ti) and gold (Au) may be sequentially deposited on the substrate 410 and may be patterned to form a pad electrode 420. The pad electrode 420 may include a first pad electrode layer 422 disposed on the substrate 410 and a second pad electrode layer 424 disposed on the first pad electrode layer 422.

Figure 6:
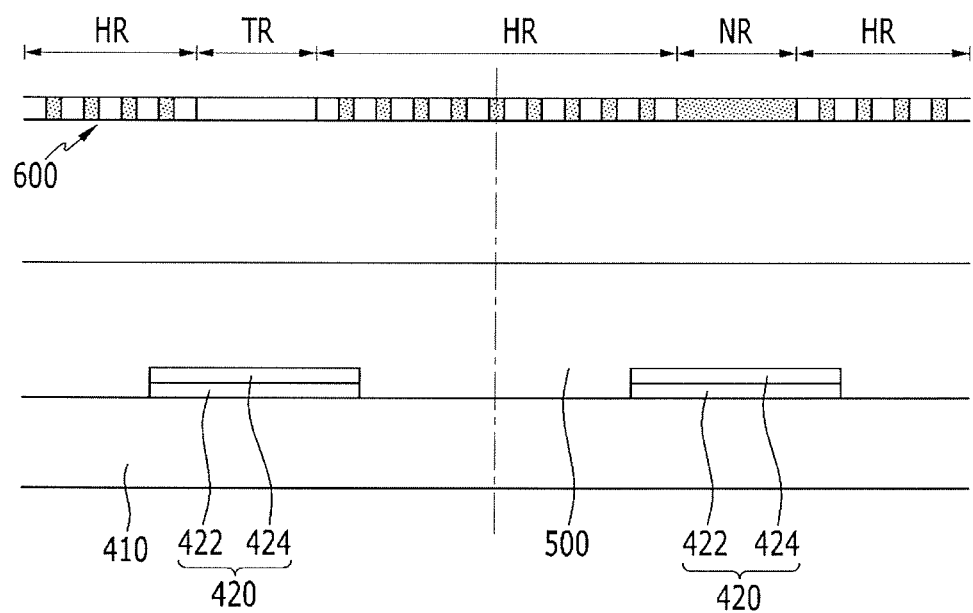

As shown in FIG. 6, a photosensitive polymer material may be applied to the substrate 410 and the pad electrode 420 to form an organic insulating material layer 500. The organic insulating material layer 500 may include a polymer material such as polyimide, polybenzoxazole, acryl, phenol, silicon, silicon modified polyimide, and/or epoxy.

A mask 600 is provided to correspond to the organic insulating material layer 500 and an exposure process is performed.

The mask 600 may be, for example, a slit mask or a half-tone mask. The mask 600 includes a non-transmitter (NR), a half-transmitter (HR), and a transmitter (TR). When the mask 600 is a slit mask, the half-transmitter (HR) may have a slit shape.

Light is not transmitted to a portion of the organic insulating material layer 500 corresponding to the non-transmitter (NR) of the mask 600. Part of light is transmitted to a portion of the organic insulating material layer 500 corresponding to the half-transmitter (HR) of the mask 600. Sufficient light is transmitted to a portion of the organic insulating material layer 500 corresponding to the transmitter (TR) of the mask 600 to harden photosensitive material against removal when negative photoresist is used or to weaken the photosensitive material to be removed when positive photoresist is used.

Figure 7:
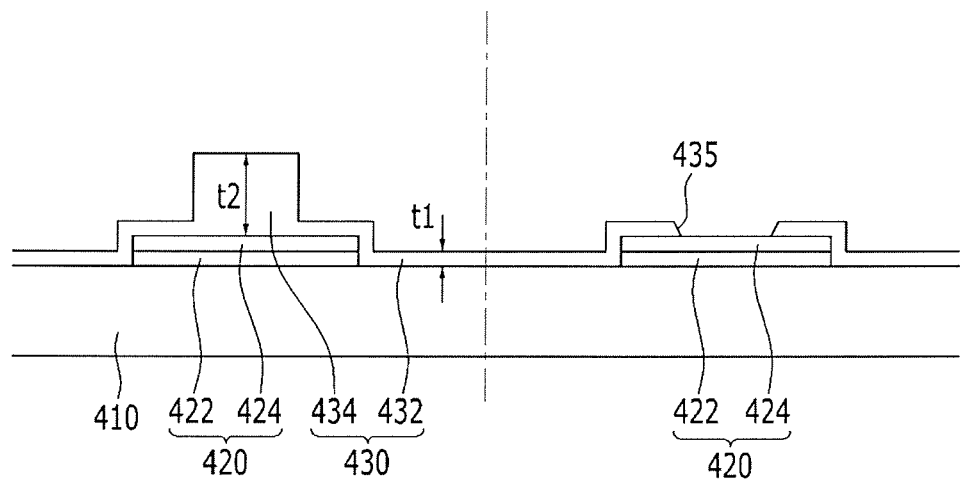

When the organic insulating material layer 500 is developed and patterned by an exposure process, a passivation layer 430 is formed as shown in FIG. 7. In an exemplary embodiment of the present inventive concept, the organic insulating material layer 500 may be made of a negative photosensitive material. When the organic insulating material layer 500 is made of a negative photosensitive material, a portion that is not exposed to light is removed, a portion that is exposed to part of the light becomes thinner, and a portion that is exposed to sufficient light, to harden the photosensitive material against removal or etching, remains. However, exemplary embodiments of the present inventive concept are not limited thereto. For example, the organic insulating material layer 500 may be made of a positive photosensitive material. When the organic insulating material layer 500 is made of a positive photosensitive material, a portion of the positive photosensitive material that is exposed to sufficient light, to remove or etch the photosensitive material, is removed, a portion thereof that is exposed to part of the light becomes thinner, and a portion thereof that is not exposed to light remains. Accordingly, different designs of the mask 600 may be used.

The portion of organic insulating material layer 500 that became thinner becomes the insulating portion 432 of the passivation layer 430. The remaining portion of the organic insulating material layer 500 becomes the bump portion 434 of the passivation layer 430. The insulating portion 432 and the bump portion 434 of the passivation layer 430 are simultaneously formed during a same process, and they are integrally formed. The portion of the organic insulating material layer 500 removed becomes a contact hole 435 exposing at least part of the pad electrode 420.

The insulating portion 432 covers an edge region of the pad electrode 420 and the substrate 410. The insulating portion 432 may be disposed on the edge region of the pad electrode 420 and the substrate 410. The insulating portion 432 has a first thickness t1. The insulating portion 432 may have a substantially constant thickness.

The bump portion 434 covers a center portion of the pad electrode 420. The bump portion 434 may be disposed on the pad electrode 420. The bump portion 434 has a second thickness t2, and the second thickness t2 is greater than the first thickness t1.

The contact hole 435 exposes at least part of the pad electrode 420.

Figure 8:
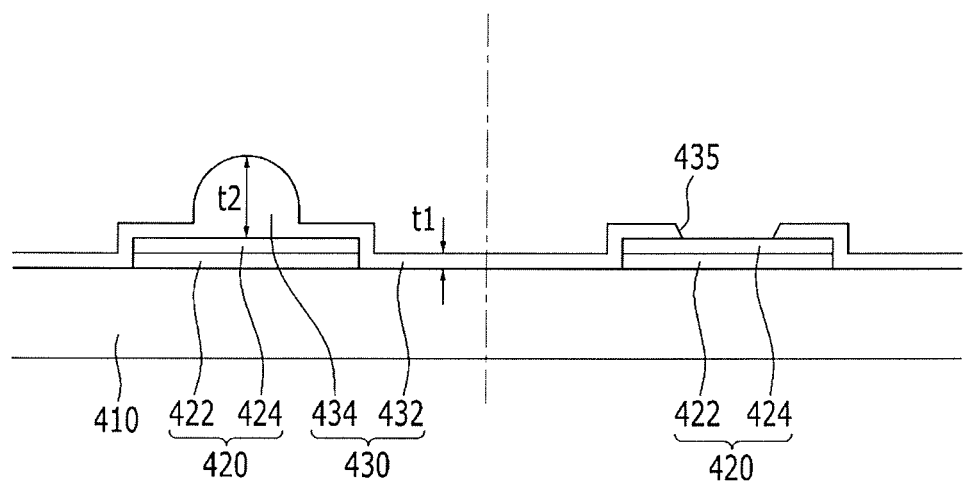

As shown in FIG. 8, a process for curing the passivation layer 430 is performed. When the passivation layer 430 is provided, UV rays or heat may be applied thereto to cure the passivation layer 430. In this case, a shape of the bump portion 434 of the passivation layer 430 may be changed, and a cross-sectional shape of the bump portion 434 may become semicircular. Therefore, the bump portion 434 might not have a constant thickness. For example, a center portion of the bump portion 434 has the greatest second thickness t2, and it may gradually become thinner as it goes to an edge portion of the bump portion 434 from the center portion.

Figure 9:
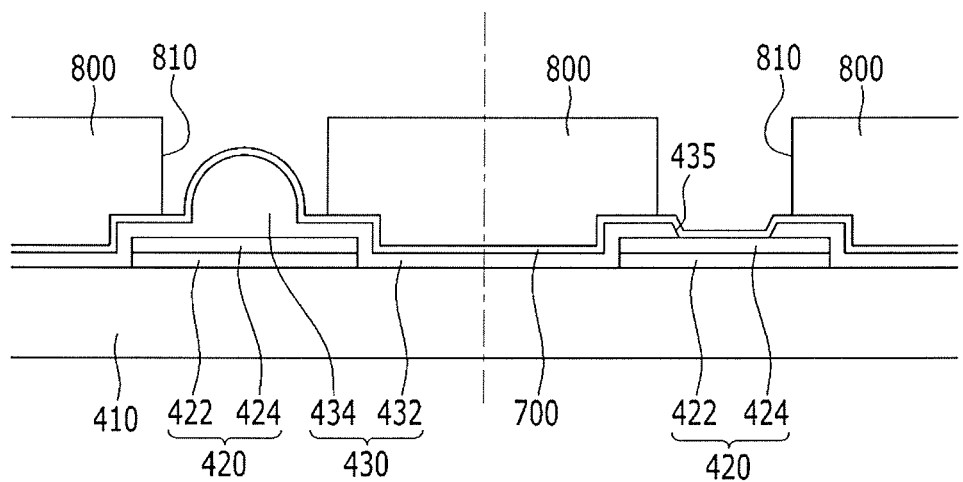

As shown in FIG. 9, a metal seed layer 700 is disposed on the passivation layer 430.

A photosensitive organic material is disposed on the metal seed layer 700 and is patterned to form a photoresist pattern 800. The photoresist pattern 800 includes an opening region 810.

Figure 10:
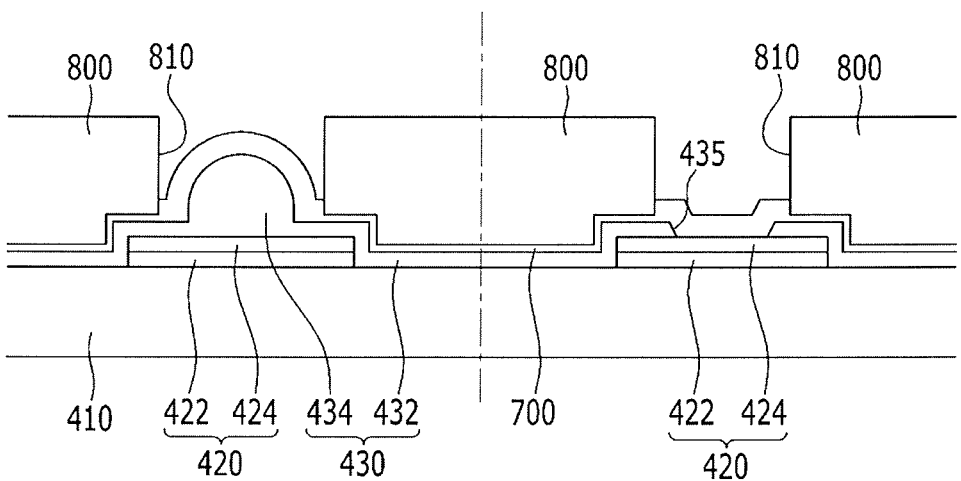

As shown in FIG. 10, the metal seed layer 700 disposed in the opening region 810 of the photoresist pattern 800 is grown using an electroplating method. Accordingly, a thickness of the metal seed layer 700 disposed below the photoresist pattern 800 is not changed. Further, the metal seed layer 700 disposed inside the opening region 810 of the photoresist pattern 800 becomes thicker.

Figure 11:
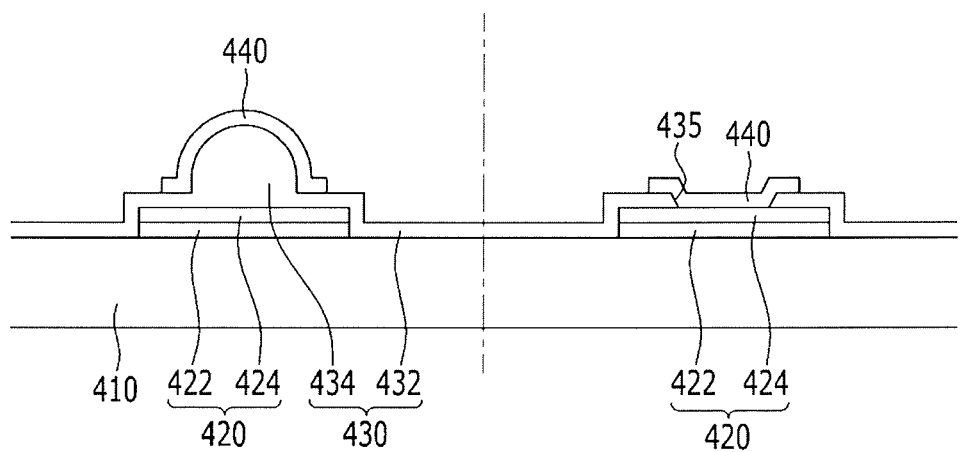

As shown in FIG. 11, the photoresist pattern 800 is removed.

The metal seed layer 700 is etched to remove a portion excluding the portion where the metal seed layer 700 grows and forms a bump electrode 440. The metal seed layer 700 disposed below the photoresist pattern 800 is removed. The metal seed layer 700 disposed inside the opening region 810 of the photoresist pattern 800 is grown and becomes thick so that it can be etched to a predetermined thickness and its remaining portion forms a bump electrode 440.

The bump electrode 440 is connected to the pad electrode 420 through the contact hole 435. The bump electrode 440 receives a predetermined signal from the pad electrode 420 and transmits the same to the wiring substrate (e.g., 100 of FIG. 1).

An integrated circuit (IC) according to an exemplary embodiment of the present inventive concept will now be described with reference to FIG. 12.

Figure 12:
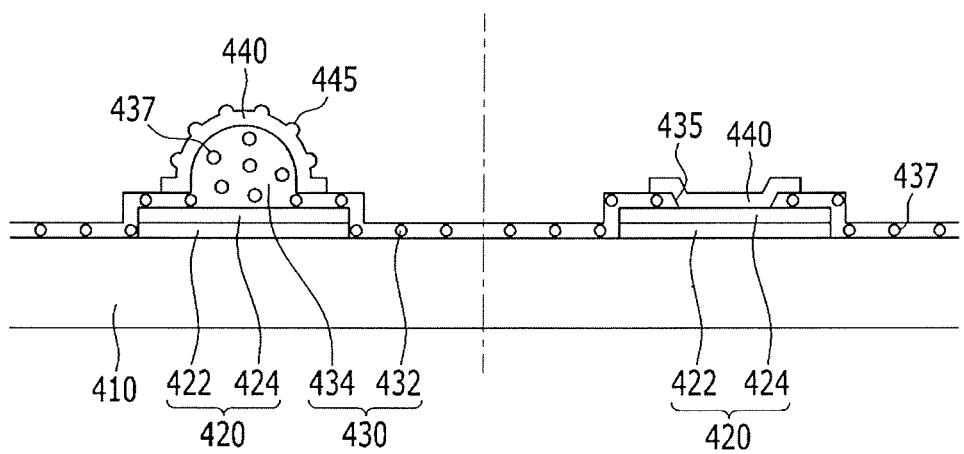
FIG. 12 shows a cross-sectional view of an integrated circuit (IC) according to an exemplary embodiment of the present inventive concept.

A substantial number of elements and features of the IC shown in FIG. 12 may be assumed to be similar to corresponding elements of the IC shown in FIG. 1 to FIG. 4. In an exemplary embodiment of the present inventive concept, the passivation layer may include non-conductive particles.

FIG. 12 shows a cross-sectional view of an IC according to an exemplary embodiment of the present inventive concept.

As shown in FIG. 12, the IC includes a substrate 410, a pad electrode 420 disposed on the substrate 410, a passivation layer 430 disposed on the pad electrode 420, and a bump electrode 440 disposed on the passivation layer 430.

The passivation layer 430 may be made of a photosensitive polymer material and may further include non-conductive particles 437. The non-conductive particles 437 may have a shape similar to beads.

A protrusion 445 is provided on an upper surface of the bump electrode 440 provided on the passivation layer 430.

An organic insulating material layer 500 (e.g., as shown in FIG. 6) including non-conductive particles 437 is disposed on the substrate 410 and the pad electrode 420 and is patterned to form the insulating portion 432 and the bump portion 434 of the passivation layer 430. A protrusion 445 may be formed on an upper surface of the bump electrode 440 by the non-conductive particles 437 of the passivation layer 430. The protrusion 445 provided on the upper surface of the bump electrode 440 may be omitted.

In an exemplary embodiment of the present inventive concept, when the IC and the wiring substrate are pressurized, indentations may occur because of the non-conductive particles 437. Accordingly, it may be easily determined whether the IC and the wiring substrate are correctly pressurized according to whether an indentation is found.

An oxide layer may be generated naturally on an upper surface of the pad portion of the wiring substrate. In an exemplary embodiment of the present inventive concept, when the IC and the wiring substrate are pressurized, the IC may stably access an electrode of the pad portion of the wiring substrate while penetrating the oxide layer by the protrusion 445 of the bump electrode 440.

An IC according to an exemplary embodiment of the present inventive concept will now be described with reference to FIG. 13

Those elements and features of the IC shown in FIG. 13 and not described below may be assumed to be similar to corresponding elements of the IC shown in FIG. 1 to FIG. 4. In an exemplary embodiment of the present inventive concept, one pad 405 may include a plurality of bump portions.

Figure 13:
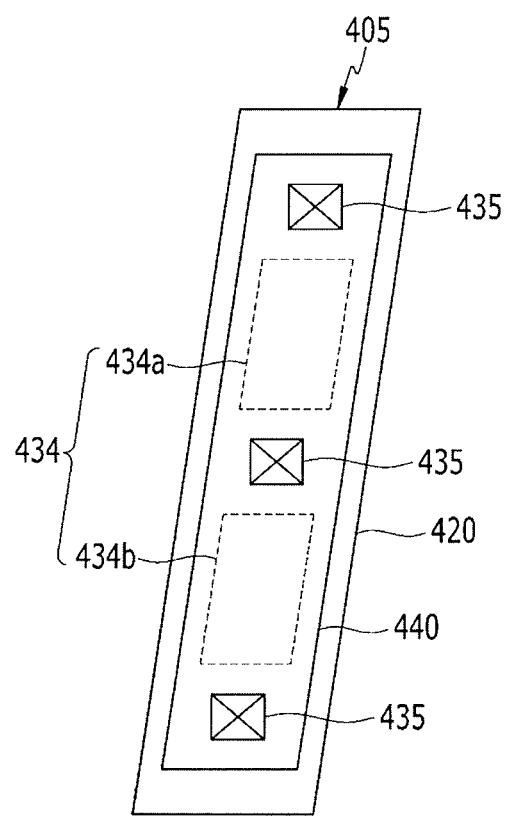
FIG. 13 shows a plan view of an integrated circuit (IC) according to an exemplary embodiment of the present inventive concept.

FIG. 13 shows a plan view of an IC according to an exemplary embodiment of the present inventive concept.

As shown in FIG. 13, the IC includes a substrate 410, a pad electrode 420 disposed on the substrate 410, a passivation layer 430 disposed on the pad electrode 420, and a bump electrode 440 disposed on the passivation layer 430.

The passivation layer 430 includes an insulating portion 432 and a bump portion 434.

The bump portion 434 of the passivation layer 430 may include a first bump portion 434a and a second bump portion 434b. The first bump portion 434a and the second bump portion 434b overlap the same pad electrode 420. However, exemplary embodiments are not limited thereto, and one pad electrode 420 may overlap at least three or more bump portions.

A contact hole 435 is provided in an insulating portion 432 of the passivation layer 430. One contact hole 435 is provided adjacent to a first end of the first bump portion 434a, one contact hole 435 is provided adjacent to a second end opposite a first end of the second bump portion 434b, and one contact hole 435 is provided between the first bump portion 434a and the second bump portion 434b. For example, one contact hole 435 may be provided between a second end opposite the first end of the first bump portion 434a and a first end of the second bump portion 434b. However, the number of contact holes 435 formed and positions of the contact holes 435 may be changed in various ways.

The bump electrode 440 covers the first bump portion 434a and the second bump portion 434b. The first bump portion 434a and the second bump portion 434b overlap the same bump electrode 440. For example, one bump electrode 440 may overlap two bump portions 434a and 434b. However, exemplary embodiments of the present inventive concept are not limited thereto, and one bump electrode 440 may overlap at least three or more bump portions.

The exemplary embodiments of present inventive concept illustrate an effort to stabilize an electrical connection of an integrated circuit (IC).

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. An integrated circuit comprising:
   a substrate;
   a pad electrode disposed on the substrate;
   a passivation layer disposed on the pad electrode and including an organic insulating material; and
   a bump electrode disposed on the passivation layer in a first region of the substrate and connected to the pad electrode through a contact hole in a second region of the substrate,
   wherein the passivation layer includes an insulating portion having a first thickness and covering an adjacent edge region of the pad electrode and the substrate, and a bump portion having a second thickness, that is greater than the first thickness, and covering a center portion of the pad electrode.

2. The integrated circuit of claim 1, wherein
   the bump portion of the passivation layer is disposed on the pad electrode.

3. The integrated circuit of claim 1, wherein
   the contact hole is disposed in an insulating portion of the passivation layer.

4. The integrated circuit of claim 1, wherein
   the pad electrode includes multiple layers.

5. The integrated circuit of claim 1, further comprising
   a protrusion disposed on an upper surface of the bump electrode.

6. The integrated circuit of claim 5, wherein
   the passivation layer further includes non-conductive particles.

7. The integrated circuit of claim 1, wherein
the passivation layer includes a plurality of bump portions, and
the pad electrode overlaps at least two bump portions of the plurality of bump portions.

8. The integrated circuit of claim 1, wherein the bump electrode is disposed on the bump portion of the passivation layer.

9. An integrated circuit comprising:
a substrate;
a pad electrode disposed on the substrate;
a passivation layer disposed on the pad electrode and including an organic insulating material; and
a bump electrode disposed on the passivation layer in a first region of the substrate and connected to the pad electrode through a contact hole in a second region of the substrate,
wherein the passivation layer includes an insulating portion having a first thickness and covering an adjacent edge region of the pad electrode and the substrate, and a bump portion having a second thickness, that is greater than the first thickness, and covering a center portion of the pad electrode, wherein
the bump portion of the passivation layer has a semicircular shaped cross-section.

10. The integrated circuit of claim 1, wherein
the passivation layer includes a photosensitive organic material.

11. The integrated circuit of claim 10, wherein
the passivation layer includes polyimide, polybenzoxazole, acryl, phenol, silicon, silicon modified polyimide, or epoxy-based polymer materials.

12. A method for manufacturing an integrated circuit, comprising:
forming a pad electrode on a substrate;
forming an organic insulating material layer on the pad electrode and the substrate;
patterning the organic insulating material layer to form a passivation layer including an insulating portion having a first thickness and covering an edge region of the pad electrode and at least part of the substrate, and a bump portion having a second thickness, that is greater than the first thickness, and covering a substantially center portion of the pad electrode; and
forming a bump electrode on the passivation layer in a first region of the substrate and connected to the pad electrode in a second region of the substrate.

13. The method of claim 12, wherein
a slit mask or a half-tone mask is used in the patterning of the organic insulating material layer.

14. The method of claim 12, further comprising
curing the passivation layer after forming the passivation layer.

15. The method of claim 12, further comprising:
forming a metal seed layer on the passivation layer;
forming a photoresist pattern including an opening region on the metal seed layer;
growing the metal seed layer disposed inside the opening region using an electroplating method;
removing the photoresist pattern; and
etching the metal seed layer to remove a portion excluding a portion where the metal seed layer grows, and forming a bump electrode.

16. The method of claim 12, further comprising
forming a contact hole in an insulating portion of the passivation layer and overlapping at least part of the pad electrode,
wherein the bump electrode is connected to the pad electrode through the contact hole.

17. The method of claim 12, wherein
the bump portion of the passivation layer is disposed on the pad electrode.

18. The method of claim 12, wherein
the bump portion of the passivation layer has a semicircular shaped cross-section.

19. The method of claim 12, wherein
the organic insulating material layer includes polyimide, polybenzoxazole, acryl, phenol, silicon, silicon modified polyimide, or epoxy-based polymer materials.

20. The method of claim 12, wherein
the organic insulating material layer includes non-conductive particles, and a protrusion is formed on an upper surface of the bump electrode.

21. The method of claim 12, wherein
the passivation layer includes a plurality of bump portions, and
the pad electrode overlaps at least two of the plurality of bump portions.

* * * * *